United States Patent [19]

Yusa et al.

[11] Patent Number: 4,686,555

[45] Date of Patent: Aug. 11, 1987

[54] SOLID STATE IMAGE SENSOR

[75] Inventors: Atsushi Yusa, Ina; Jun-ichi Nishizawa, Sendai; Sohbe Suzuki, Sendai; Takashige Tamamushi, Sendai, all of Japan

[73] Assignee: Olympus Optical Co., Ltd., Japan

[21] Appl. No.: 556,347

[22] Filed: Nov. 30, 1983

[30] Foreign Application Priority Data

Dec. 14, 1982 [JP] Japan ................................. 57-217755

[51] Int. Cl.⁴ ...................... H01L 27/14; H01L 31/00
[52] U.S. Cl. ........................................................ 357/30
[58] Field of Search ............................... 357/30, 41, 45

[56] References Cited

U.S. PATENT DOCUMENTS 4,377,817 3/1983 Nishizawa et al. .................... 357/30

4,381,517 4/1983 Harada ................................. 357/30

Primary Examiner—Robert E. Wise
Attorney, Agent, or Firm—Parkhurst & Oliff

[57] ABSTRACT

A solid state image sensor comprising static induction transistors each forming a picture element.

Each static induction transistor in the solid state image sensor has a lateral structure in which the source and drain regions are formed by surface regions provided on the same side in an epitaxial layer forming the channel region and a signal charge storage gate region are formed by a buried gate region provided under the channel region and a surface gate region provided on the channel region, so that the source-drain current flows in parallel to the surface of epitaxial layer and is effectively controlled between the buried and surface gate regions.

4 Claims, 7 Drawing Figures

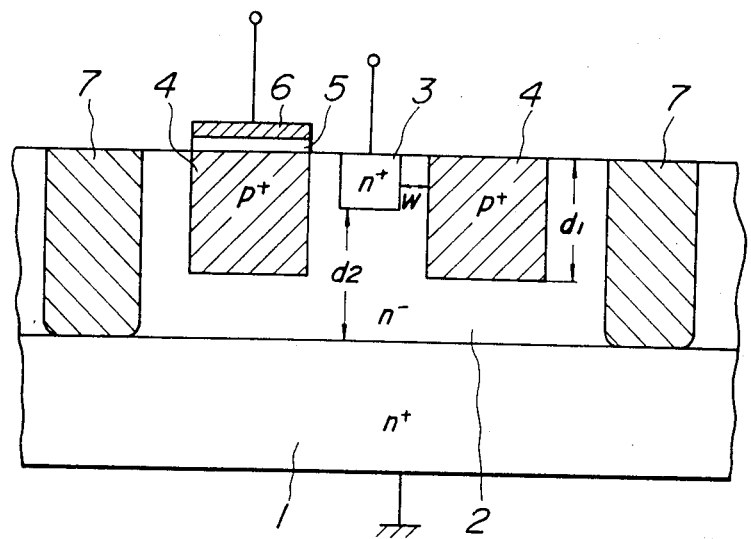
FIG_1
PRIOR ART

FIG_3A
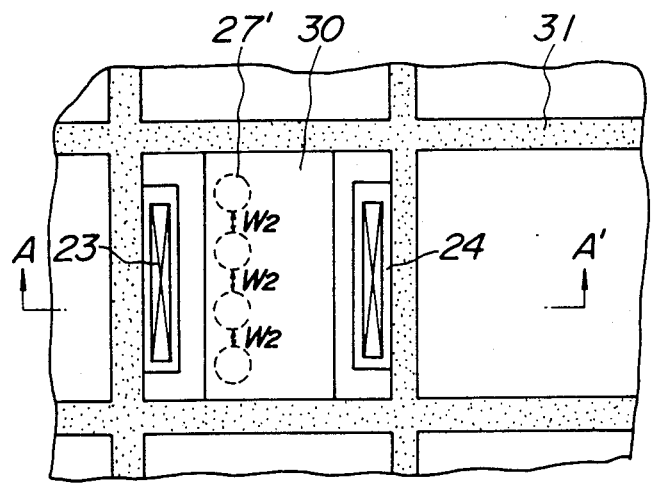
FIG_3B
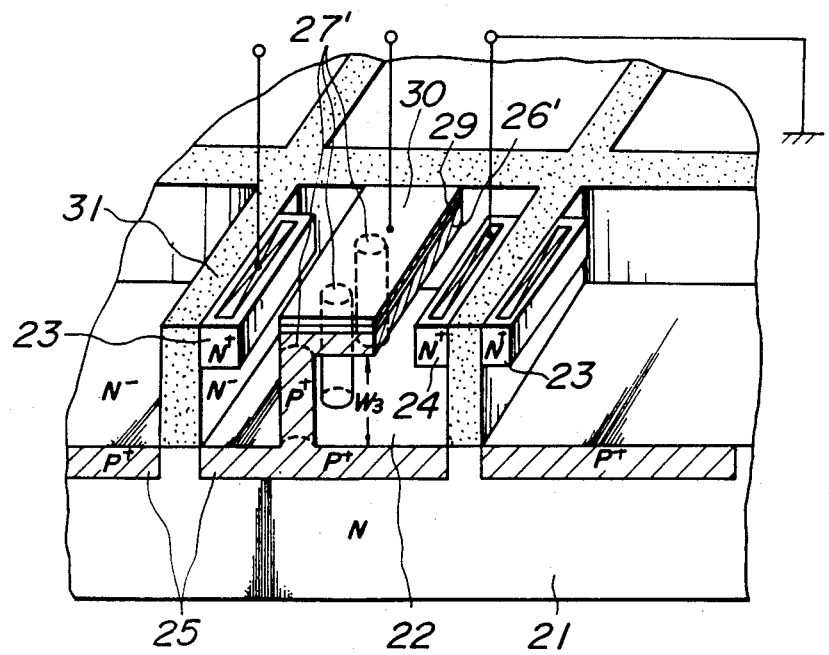

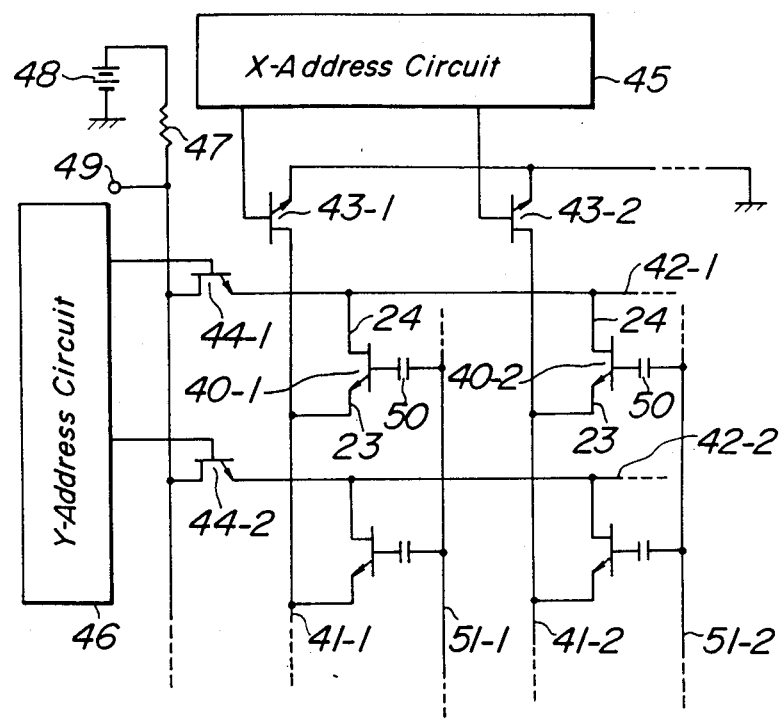
FIG_4

SOLID STATE IMAGE SENSOR

BACKGROUND OF THE INVENTION

The invention relates to a solid state image sensor comprising static induction transistors (SITs) arranged in a matrix, each SIT having both a photoelectric converting function and a switching function for signal readout and forming a picture cell.

Such a solid state image sensor comprising a SIT matrix is known from Japanese Patent Laid Open No. 55-15229. FIG. 1 shows a sectional view of the static induction transistor forming a picture element in the known image sensor.

As shown in FIG. 1, the known SIT transistor has a vertical structure in which a drain region is formed by an n+ type substrate 1, a source region is formed by an n+ type region 3 provided in a surface of an n− type epitaxial layer 2 which is deposited on the substrate 1 and forms a channel region, and in the surface of the epitaxial layer 2 there is further provided a signal charge storage gate region 4 which surrounds the source region 3. On this gate region 4 there is provided an insulating film 5 on which is provided an electrode 6 to form a so-called MIS gate electrode having an electrode/insulating film/gate region structure. The doping concentration of the n− type epitaxial layer 2 forming the channel region is selected such that the channel region 2 is depleted and pinched off by a high potential barrier even when no bias voltage is applied on the gate electrode 6.

The principle of operation of such an SIT is as follows. In the condition where there is no biasing between the drain and the source of the SIT, when rays of light are incident on the channel and gate regions 2 and 4, electron-hole pairs are produced in these regions, the holes of the pairs are stored in the gate region 4, while the electrons are drained through the drain region 1 to the ground. The holes stored in the gate region by the incident light raise the potential of the gate region 4 and lower the potential barrier in the channel region 2 according to the incident light. When a bias voltage is applied between the drain and the source and a forward voltage is applied to the gate electrode 4, then a current flows through the source-drain path, which current depends on the amount of the holes stored in the gate region 4, whereby an amplified output is obtained for the optical input. The optical amplification factor $\mu$ of the SIT is usually $10^3$ or more and hence the sensitivity thereof is 10 or more times as high as that of a conventional bipolar transistor. The optical amplification factor $\mu$ is described as $$\mu = \frac{d_1 d_2}{w^2}$$

where w is a distance between the gate and source regions, $d_1$ is a depth of the gate region and $d_2$ is a distance between the source and drain regions (which corresponds to the thickness of the n− epitaxial layer 2 when the N+ source region 3 is very thin). As apparent from this formula, in order to obtain a much higher optical amplification factor $\mu$ the distance w must be made small while the thickness of the epitaxial layer 2 and the depth of the gate region 4 must be made large. For example, in order to obtain the amplification factor $\mu$ of $10^3$–$10^4$, in usual $d_2 = 5$–$6$ μm and $d_1 = 2$–$3$ μm are required. In the image sensor it is further necessary to provide an isolation region 7 between the SITs in order to isolate the signal charges stored in the respective SITs. In general, the isolation region may be formed by means of local oxidation, diffusion or V-shaped groove formation, etc. so as to extend through the epitaxial layer 2 from the surface thereof to the substrate. Thus, if the epitaxial layer 2 has a large thickness the formation of the isolation region becomes difficult. Further, the formation of deep gate region 4 by means of diffusion etc. which improves the optical amplification factor has a limitation. Moreover, the deep gate region strongly absorbs the incident light rays and thus the spectral sensitivity is deteriorated. Accordingly, the solid state image sensor comprising vertical SITs has a limitation in the improvement of its sensitivity because of its structure as described above.

SUMMARY OF THE INVENTION

An object of the invention is to eliminate the drawbacks described above and to provide a solid state image sensor in which each static induction transistor forming a picture element has a lateral structure and which has a higher performance and can easily be manufactured.

According to the invention there is provided a solid state image sensor comprising static induction transistors each forming a picture element, wherein said static induction transistor comprises source and drain regions which are provided in one and the same surface of a semiconductor body and a signal charge storage gate region which is provided between the source and drain regions, whereby said static induction transistor has a lateral structure in which a source-drain current flows in parallel to said surface of the semiconductor body.

BRIEF DESCRIPTION OF THE DRAWINGS

The invention will now be described in greater detail with reference to the accompanying drawings, wherein:

FIG. 1 shows a sectional view of the static induction transistor forming a picture element in the known image sensor.

FIG. 3A is a top plan view of a second embodiment of a lateral SIT in the solid state image sensor according to the invention and FIG. 3B is a sectional view taken along a line A—A' of FIG. 3A; and FIG. 4 shows a circuit arrangement of the solid state image sensor according to the invention.

DESCRIPTION OF THE PREFERRED EMBODIMENT

Figure 2A:
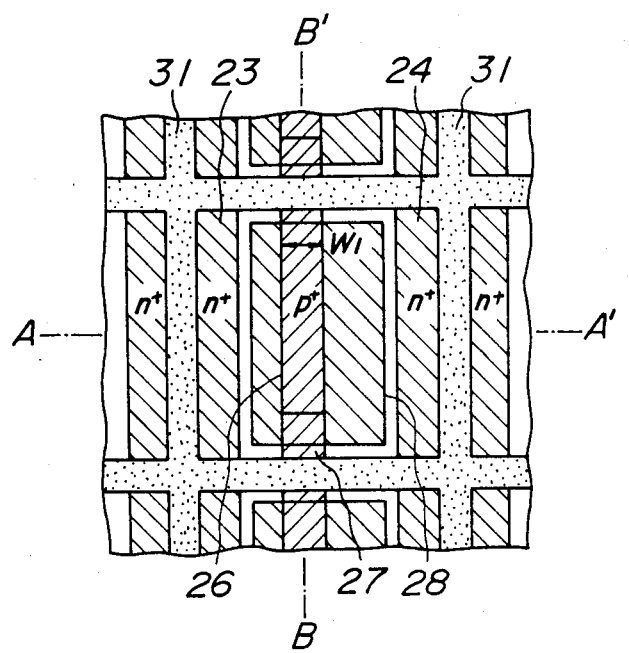
FIG. 2A is a top plan view of a first embodiment of a lateral SIT in the solid state image sensor according to the invention.
Figure 2C:
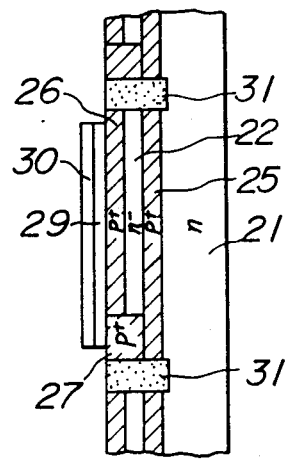
FIG. 2C is a sectional view taken along a line B—B' of FIG. 2A.
Figure 2B:
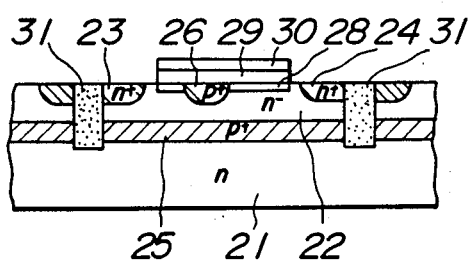
FIG. 2B is a sectional view taken along a line A—A' of FIG. 2A

In FIG. 2, 21 is an n type silicon substrate, 22 is an n− type epitaxial layer formed on the substrate 21, 23 is an n+ source region diffused in the surface of the epitaxial layer 22 and 24 is an n+ drain region which is also diffused in the surface of the epitaxial layer 22, the n− epitaxial layer 22 forming a channel region. Further, 25 is a buried gate region which is formed on the substrate 21 (and beneath the channel region 22) as a p+ buried layer and 26 is a p+ type surface gate region diffused in the surface of the channel region 22 between the source and drain regions. Both gate regions 25 and 26 store the signal charges generated in the channel region 22 in response to the optical input and are interconnected by means of a p+ diffused region 27 to form signal charge storage regions which control the potential barrier in the channel between the source and the drain from both sides by the static induction effect of the gate voltage thereon. In order to avoid increasing the resistance of the pinched-off channel region the width $w_1$ of the surface gate region is made narrow, but in order to enlarge the area of the p-n junction for photoelectric conversion between the gate and channel regions a very thin p+ surface region 28 may be formed on the channel region by means of, for example, ion implantation. On the p+ regions 26 and 28 there is provided an insulating film 29 such as $SiO_2$ etc., on which film is provided an electrode 30 to form an MIS type gate electrode. Finally, 31 is an isolation region for isolating the lateral SITs from each other, each SIT comprising a source region 23, a drain region 24 and signal charge storage gate regions 25, 26, 27 and 28.

In the above mentioned lateral SIT, when a light is incident thereon, hole-electron pairs are generated in the channel region 22 and the holes are stored in the p+ signal charge storage gate regions 25, 26, 27 and 28. Since these gate regions are interconnected to each other, the potentials of these regions have the same value and change equally according to the amount of the holes stored in the gate regions. Therefore, the potential barrier in the channel region 22 is effectively controlled between the buried and surface gate regions 25 and 26 by the potential change of the gate regions. In other words, a slight change of gate potential produces a large change of a source-drain current and thus a greatly amplified output can be obtained. Moreover, in this embodiment since the surface gate region 26 has a small width $w_1$, the potential barrier is produced only in a very narrow area of the channel region, whereby good SIT operation is obtained. Further, the vertical distance between the surface and buried gate regions may be about 1-2 μm by controlling the thickness of the epitaxial layer 2 and the diffusion depth of the surface gate region 26. Thus, in the present lateral SIT the amplification factor can be easily made very high as compared to the conventional vertical SIT. Further, the p+ region 28 formed on the channel region 22 is very thin, so that short wavelength radiations are not absorbed in the p+ region 28. Consequently, the lateral SIT having the properties described above can be used to realize the image sensor having a high sensitivity and a high packing density in a simple manner.

FIG. 3A is a top plan view of the second embodiment according to the invention and FIG. 3B is a sectional view taken along a line A—A' of FIG. 3A. In FIG. 3 like numerals are used to denote the elements corresponding to those shown in FIG. 2.

In this embodiment, as in the previous embodiment the source and drain regions 23 and 24 are formed in the surface of the n− epitaxial layer 22 forming the channel region. However, in this embodiment the distance between the gate regions for controlling the potential barrier in the channel region is made smaller in horizontal direction than in the vertical direction. To this end, in this embodiment the surface gate region 26' is formed as a larger and thinner region than that of the previous embodiment shown in FIG. 2 and a plurality of grid gate regions 27' are provided between the buried and surface gate regions 25 and 26, the distance $w_2$ between the grid gate electrodes 27' being made smaller than the distance $w_3$ between the buried and surface gate regions 25 and 26.

In the lateral SIT described above when light is incident through the surface gate region 26' into the channel region 22, electron-hole pairs are generated therein, the electrons thereof flow away and the holes thereof are stored in the surface and buried gate regions 26' and 25. Since the surface and buried gate regions 26' and 25 are interconnected by the grid gate regions 27', these gate regions 25, 26' and 27' have the same potential which varies according to the amount of the stored charges therein. Thus, the potential barrier in the channel region 22 is effectively controlled between the surface and buried gate regions 26' and 25 and in addition between the grid gate regions 27'. As a result, a slight change of the gate potential provides a large change of the source-drain-current, so that very good SIT operation and a very high amplification factor can be obtained.

Therefore, the solid state image sensor comprising the lateral SITs as shown in FIG. 2 and FIG. 3 has the following advantages:

(1) the optical amplification factor can be made very high;
(2) the gate regions (28, 26') may have a large area and a small thickness, so that the spectral sensitivity may be improved;
(3) the n− epitaxial layer (22) forming the channel region may have a smaller thickness, so that the isolation between the SITs may be achieved in a simple manner;
(4) the distance between the source and drain regions (23 and 24) is determined by a mask used for diffusing them, so that the amplification factor can easily be adjusted by adjusting the distance (in the vertical SIT the distance depends on the thickness of the epitaxial layer, so that the amplification factor can not easily be adjusted);
(5) the n− epitaxial layer 22 may have a small thickness, so that the isolation region (31) can be formed with a small width, as a result of which the packing density can be improved.

Finally, a circuit arrangement of the solid state image sensor comprising the above described lateral SITs arranged in a matrix will be described with reference to FIG. 4. In FIG. 4, 40-1, 40-2, ... are the SITs as shown in FIG. 2 or FIG. 3, the sources 23 of the SITs in each column being commonly connected to corresponding X-selection lines 41-1, 41-2, ..., and the drains 24 of the SITs in each row being commonly connected to corresponding Y-selection lines 42-1, 42-2, ... 43-1, 43-2, ... are X-selection switches, 44-1, 44-2, ... are Y-selection switches, 45 and 46 are X- and Y-address circuits consisting of for example shift registers, 47 is a load resistor, 48 is a supply source and 49 is an output terminal. Moreover, 50 is a capacitance of the MIS gate electrode of the SIT. This capacitance Cg is made much larger than the junction capacitance Cj between the source and gate regions, i.e. Cg>>Cj (if Cg is too small, the voltage applied on the gate is applied across the capacitance Cg and thus the effective voltage applied between the gate and the channel becomes small). 51-1, 51-2, ..., are clear lines for supplying clear pulses to the gates of the SITs, respectively to clear the charges stored therein.

The output of each SIT is read out in the following manner. For example, when the X-selection switch 43-1 is turned on by the X-address circuit 45 during a period in which the Y-selection switch 44-1 is turned on by the Y-address circuit 46, the SIT 40-1 is selected and then the drain currrent of this SIT flows through the load resistor 47 to produce an output voltage at the output terminal 49. As described above, the drain current is a function of the gate voltage, which voltage is a function of the optical input, so that the output voltage depends on the optical input and has a value greatly amplified by the SIT.

The solid state image sensor comprising lateral SITs has, in addition to the advantages described above, a further advantage that both the X- and Y-selection lines in the circuit arrangement as shown in FIG. 4 can be formed as surface electrodes so that the line resistances and stray capacitances can be reduced as compared to the conventional image sensor comprising vertical SITs in which buried regions are formed as X- or Y-selection lines. Consequently, the time constant on signal reading out becomes small and thus a high speed reading-out can be effected in a stable manner.

The present invention is not limited to the embodiments described above, but many modifications may be conceived by those skilled in the art within the scope of the invention. For example, the conductivity type of each region of the SITs in each embodiment may be inverted to construct p channel SITs.

What is claimed is:

1. A solid state image sensor comprising a plurality of static induction transistors each forming a picture cell of the image sensor, each static induction transistor comprising:

a semiconductor body including an epitaxial layer provided on a substrate;

a drain region formed in a surface of said epitaxial layer;

a source region formed in said surface of said epitaxial layer, said epitaxial layer forming a channel region between said source and drain regions;

a signal charge storage gate region formed between said source and drain regions, said signal charge storage gate region comprising a buried gate region formed under said channel region and a surface gate region formed on said channel region, said buried and said surface gate regions being interconnected by means of a connection region; and whereby said static induction transistor has a lateral structure in which a source-drain current flows in said channel region in parallel with said surface of said epitaxial layer.

2. A solid state image sensor as recited in claim 1 wherein said surface gate region comprises a first surface gate region having a narrow width, and a second surface gate region having a small thickness and a large area formed on said surface of said epitaxial layer.

3. A solid state image sensor as recited in claim 1 wherein said connection region comprises a plurality of grid gate regions.

4. A solid state image sensor as recited in claim 1 wherein an insulating layer and an electrode is formed on said signal charge storage gate region to form a so-called MIS-type gate electrode.

* * * * *